United States Patent
Eisen et al.

(10) Patent No.: US 6,331,705 B1
(45) Date of Patent: Dec. 18, 2001

(54) ROOM TEMPERATURE SOLID STATE GAMMA OR X-RAY DETECTORS

(75) Inventors: Yosef Eisen, Rishon LeZion; Asher Shor, Jerusalem, both of (IL)

(73) Assignee: State of Israel, Atomic Energy Commission, Yavne (IL)

( * ) Notice: Subject to any disclaimer, the term of this patent is extended or adjusted under 35 U.S.C. 154(b) by 0 days.

(21) Appl. No.: 09/435,482

(22) Filed: Nov. 8, 1999

Related U.S. Application Data

(63) Continuation-in-part of application No. PCT/IL98/00215, filed on May 8, 1998.

(30) Foreign Application Priority Data

May 8, 1997 (IL) ......................................... 120807
Nov. 11, 1998 (IL) ......................................... 126992

(51) Int. Cl.$^7$ ................................................ G01T 1/24
(52) U.S. Cl. ............................... 250/370.01; 250/370.13
(58) Field of Search ........................... 250/370.01, 370.1, 250/370.13, 370.12, 370.14

(56) References Cited

U.S. PATENT DOCUMENTS 4,996,432   2/1991   Saitou ............................. 250/370.01

FOREIGN PATENT DOCUMENTS 59-132382   7/1984   (JP) .
63-98582    4/1988   (JP) .

OTHER PUBLICATIONS

Nuclear Instruments and Methods in Physics Research, vol. A322 (1992), pp. 596–603, Y. Eisen: Current State–of–the–Art Applications Utilizing CdTe Detectors.

Nuclear Instruments and Methods in Physics Research, vol. A353, pp. 60–66, 1994, Y. Eisen & Y. Horovitz: Correction of Incomplete Charge Collection in CdTe Detectors.

IEEE Transactions on Nuclear Science, vol. 39, No. 4, 1992, pp. 605–609, J. Butler et al.: $Cd_{1-x}Zn_xTe$ Gamma Ray Detectors.

Appl. Physics Letter, vol. 65, pp. 2884–2886, 1994, P. Luke: Single–Polarity Charge Sensing in Ionization Detectors Using Coplanar Electrodes.

Phys. Rev. Lett., vol. 75, pp. 156–159, 1995, H.H. Barrett, J.D. Eskin and H.B. Barber: Charge Transport in Arrays of Semiconductor Gamma–Ray Detectors.

Classical Electrodynamics, J. D. Jackson, second edition, John Wiley Sons, New York, 1957, pp. 26–37.

Foundations of Potential Theory, Ungar, New York, 1929, O.D. Kellogg.

Nuclear Instruments and Methods, vol. 43 (1966), pp. 1–1–5, F.S. Goulding: Semiconductor Detectors for Nuclear Spectrometry, I.

Nuclear Instruments and Methods in Physics Research, vol. A253, pp. 407–417, 1987, M. Cuzin: Some New Developments in the Field of High Atomic Number Materials.

*Primary Examiner*—Georgia Epps
*Assistant Examiner*—Richard Hanig
(74) *Attorney, Agent, or Firm*—Kenyon &Kenyon

(57) ABSTRACT

The invention provides a method for detecting gamma or X-ray radiation with a room temperature solid state detector, which comprises the selection of the detector's electron trapping parameter $(\mu\tau)_e$ and/or the detector voltage V so as to tune the electron trapping to optimally compensate for the incomplete charge collection.

30 Claims, 7 Drawing Sheets

ROOM TEMPERATURE SOLID STATE GAMMA OR X-RAY DETECTORS

This application is a continuation in part of International Application PCT/IL98/00215, filed May 8, 1998 (which claims priority to Israeli Patent Application No. 120807, filed May 8, 1997), and of Israeli Application No. 126992, filed Nov. 11, 1998.

FIELD OF THE INVENTION

This invention relates to gamma and X-ray spectroscopy and imaging using room temperature solid state detectors.

BACKGROUND OF THE INVENTION AND PRIOR ART

Solid state gamma and X-ray detectors are used for many applications which require precise spectroscopic measurements. These applications include security, medical, space and astrophysical research, reactor safety, and a host of others. Room temperature operation is a very important consideration in many of these applications. A gamma or X-ray interacting in a solid state detector produces secondary ionizing radiation which create electron-hole pairs. The number of electron-hole pairs produced is directly proportional to the energy of the absorbed gamma or X-ray. Under the influence of the electric field existing between the electrodes of the detector the electrons and holes drift towards the positive and negative electrodes, respectively, where they are collected. The drifting electrons and holes induce signals on the electrodes which are then amplified. The resulting signals are proportional to the energy of the absorbed gamma or X-ray, and thus good spectroscopic measurements can be obtained. Solid state detectors and their associated electronics tend to be compact, require little power, and their stabilization time is small.

For very accurate spectroscopic measurements, germanium detectors (i.e. Ge(Li)) are used (see, for example, F.S. Goulding, Nuclear Instruments and Methods, Vol.43, pp.1–54, 1966). These detectors provide very accurate energy measurements owing to the low energy required to produce an electron-hole pair, and the correspondingly large number of electron-hole pairs produced per gamma or X-ray interaction. Germanium detectors must operate at liquid nitrogen temperatures because of the very small band gap. Since they operate at liquid nitrogen temperatures, mobilities are high and charge collection efficiencies are effectively unity for both electrons and holes. Imaging systems with germanium detectors exist, but are costly because the whole imaging system needs to be at liquid nitrogen temperature.

Gamma and X-ray detectors and imaging systems have been made also with silicon. Silicon detectors are very useful for gamma and X-rays with energies less than 20 keV. However, for gamma or X-rays with energies above 20 keV, the photoelectric absorption probability is low due to Silicon's low atomic number, Z=14.

Much effort has gone to developing room temperature solid state detectors with medium to high atomic number. Some of the materials which have shown promise are: CdTe, CdZnTe, $HgI_2$, GaAs, $PbI_2$ (M. Cuzin, Nuclear Instruments and Methods, Vol. A253, pp. 407–417, 1987; Y. Eisen, Nuclear Instruments and Methods, Vol. A322, pp. 596–603, 1992). These materials have a high absorption probability, even for gamma rays with energy of several hundred keV. However, these materials suffer from bad to poor charge transport properties for the holes. As a result, detectors from these materials exhibit incomplete charge collection properties, whereby only a fraction of the photoelectric conversions appear in a distinct photopeak, and the rest of the events show up in a broad "incomplete" energy region. To correct for this, many techniques have been developed. One of the more popular schemes, especially for CdTe detectors, involves correlating lower charge collection with longer risetimes of the pulses. The longer risetimes indicates a deeper interaction of the gamma or X-ray in the crystal, which requires a larger fraction of the collected charge to be induced by the holes (see, for example. Y. Eisen and Y. Horowitz, Nuclear Intruments and Methods, Vol. A353, pp. 60–66, 1994). Even for obtaining very good transport properties for the electrons, a fairly stringent material selection criteria must be resorted to for good detector material. These selection requirements tend to increase the material cost for good spectroscopic detectors many-fold.

Imaging systems have been constructed with an array of individual detector elements, where each detector element forms a pixel in the imaging systems. Monolithic solid state detectors with segmented readout, usually with pad (i.e. square) segmentation, with each pad serving as a pixel in the imaging system, have also been developed. Segmentation of the readout in monolithic detectors, rather than enlarging the number of individual single element detectors, is convenient and economic in that it saves a lot of processing and machining of the detector material during production.

A lot of emphasis has been placed on developing imaging systems with room temperature solid state detectors. Recently, attention has been focused on CdZnTe as a promising material for room temperature solid state gamma and X-ray detector (see, for example, J. F. Butler, C. L. Lingren, and F. P. Doty, IEEE Trans. Nuclear Science, Vol. 39, No.4, pp. 605–609, 1992). CdZnTe has a relatively high mean atomic number of Z~50 as compared to Z=32 for germanium. It also has very high resistivity of $\rho \sim 10^{11}$ $\Omega$-cm, and as a result very low leakage current. Low leakage current means very little noise, and insensitivity to changes in temperature (i.e. dark current).

CdZnTe detectors, despite exhibiting good charge transport properties for electrons, show fair to poor charge transport properties for holes. As a result, techniques for obtaining good spectroscopy using only the induced signals from the electrons have been developed, irrespective of the holes or depth of interaction. A scheme employing parallel grids at the anode, which is sensitive to the electron signal only, has been developed (P. Luke, Applied Phys.Lett., Vol. 65, pp. 2884–2886, 1994). This scheme requires fine segmentation of the positive electrode into strips with a small difference in bias between alternating strips. The electrons are collected on the strips with the slightly higher bias.

An approach using small segmented readout elements at the anode has also been developed (H. H. Barrett, J. D. Eskin, and H. B. Barber, Phys.Rev.Lett., Vol. 75, pp. 156–159, 1995). In this approach, the smaller the readout element size the less the sensitivity to incomplete charge collection of the holes, since the small readout elements would only feel induced charge from electrons drifting in close vicinity to the readout element. This approach obviously also benefits from the very fine spatial resolution accorded by the small readout elements. The main disadvantage of this technique is that it requires very fine segmentation of the detector, with the correspondingly high cost and complexity of large number of channels of electronics and also the corresponding slowness in readout acquisition time.

It should be mentioned that all these approaches for obtaining good spectroscopy using only the electron induced signal still require detectors with very good electron transport properties. This requirement imposes a fairly stringent selection criterion which reduces the yield of spectroscopic grade detector material and thereby significantly increases the cost of good spectroscopic detectors.

The present invention provides a method for obtaining excellent spectroscopic performance for room temperature solid state detectors. The method allows detector operation which essentially ignores the hole transport properties of the detector, and which is compatible with a wide variation in electron transport properties of the detector. Optimal implementation of the method of the present invention is obtained when using a detector with a segmented positive electrode, where each of the segmented elements serves as an individual readout element. Coarse segmentation of the detector is sufficient, and there is no need for fine segmentation.

The method of the present invention relies on a finely tuned balance between the effects of incomplete charge collection due to the nearly complete hole trapping on the one hand, and on the controlled amount of electron trapping on the other hand.

GLOSSARY

Segmented detector—A detector comprising a single material substrate with two electrodes usually on opposite faces of the detector, where one of the electrodes is patterned, using techniques of photolithography or other techniques, into a one or two dimensional array of detector elements typically called strips for the one dimensional array, and pads for the two dimensional array, where the pads correspond to the pixels of an image when the detector is used for imaging. A segmented detector is also referred to as a monolithic array detector or a segmented monolithic detector.

SUMMARY OF THE INVENTION

The present invention utilizes room-temperature solid state gamma and X-ray detectors. These detectors typically have two opposite electrodes with a voltage bias applied between the electrodes. If desired, the detectors can have one of the electrodes segmented with the other electrode being a common non-segmented electrode. Spectroscopic information is obtained by reading out the induced signal from one of the electrodes, after amplification and filtering by appropriate electronics. In accordance with a preferred embodiment of the invention, the positively biased electrode is segmented. A segmented detector is also referred to as a monolithic detector array, since the detector material itself is monolithic in nature, but one of the electrodes, preferably the positive electrode, is segmented into a one or two dimensional array of readout elements. Each of the segmented elements should be connected to its own individual readout electronics (usually pulse inverting charge sensitive amplifiers). It is convenient to have the segmented elements at virtual ground, and to apply a negative voltage bias on the common electrode. Readout of induced signal for our purposes is required only for those segmented elements that registered the maximum positive signal.

A gamma or X-ray photon incident on a solid state detector will interact with the solid state material of the detector creating electron/hole pairs, where the number $N_0$ of created pairs depends on the energy of the interacting photon. The drift of these electron/hole charge carriers, electrons towards the positive electrode and holes towards the negative electrode, induces a charge on the electrodes which is proportional to the energy of the incident photon.

In the case of room temperature solid state detectors, however, the large hole trapping (and to a lesser extent also the electron trapping) diminishes the induced charge on the electrodes and results in incomplete charge collection where for only a fraction of the interacting photons the maximum induced charge is measured. This effect significantly reduces the number of interactions which register a signal in the photopeak, and also results in a broad low energy tail which interferes with the possibility of simultaneous measurement of two different energies of gamma or X-rays.

Preferably, the gamma or X-ray photons are incident, on the negative, or common, electrode.

It is the object of the present invention to find compensation measures to circumvent the effects of incomplete charge collection due to the trapped holes while also improving the spectroscopic performance.

It has been found by the inventors, that the effect of nearly complete hole trapping, which results in reduced induced signal as the depth of photon interaction increases, can be offset by properly tuning the amount of electron trapping, since more electrons are trapped as the electron path length increases, i.e. for interactions which are closer to the negative electrode.

The amount of the trapped electrons and holes depends on characteristics of the detector's material and on the electric field E applied to the detector, from which:

the material characteristics can be expressed by a pair of products $(\mu\tau)_e$ and $(\mu\tau)_h$ for electrons and holes, respectively. In these products, $\mu$ is the mobility and $\tau$ is the mean lifetime of the respective carrier;

the electric field E applied to the detector is calculated as the applied voltage V divided by the detector thickness D, i.e. E=V/D.

Specific conditions for each kind of the carriers in the detector can be expressed by a combined parameter $\lambda=(\mu\tau)E$ defining the carrier mean path length, i.e.:

$$\lambda_e=(\mu\tau)_e E; \lambda_h=(\mu\tau)_h E;$$

For compensating the effect of nearly complete hole trapping by tuning the amount of electron trapping, the electrons mean path length $\lambda_e$ can be controlled.

Optimal compensation occurs at an optimum value $\lambda_e$ which defines the correct amount of the electron trapping. Such a value $[\lambda_e]_{optimum}$ is written down in equation (1):

$$[\lambda_e]_{optimum}/D=k*f(D/D_{pad}) \qquad (1)$$

where:

k is an experimentally obtained constant for matching units;

$D_{pad}$ symbolizes the dimension of the segmented element; for pad segmentation, $D_{pad}$ is a side length of a square pad of the segmented detector;

f is a function of the ratio $D/D_{pad}$ which may be determined theoretically or experimentally and determines how much electron trapping will be necessary for optimum compensation.

As has been shown in an Israeli co-pending application 120807 filed on May 8, 1997, the fine tuning of electron trapping to compensate the effect of the completely trapped holes can be performed by appropriate adjustment of the detector applied voltage. More particularly, the IL 120807 teaches on obtaining the required amount of electron trapping by applying to the detector an optimum voltage $[V]_{optimum}$, in accordance with the specific electron transport properties of the detector in question. Mathematically, and keeping in mind that $\lambda_e=(\mu\tau)_e E$, the optimum voltage $[V]_{optimum}$ was suggested to be derived from equation (1) as follows:

$$[V]_{optimum}=k/(\mu\tau)_e*D^2*f(D/D_{pad}) \qquad (2)$$

A specific form of the above equation applicable for the pad segmentation is given by the following:

$$[V]_{optimum}=2.4*D^2/(\mu\tau)_e*[(D/D_{pad})-0.4]$$

In the case of pad segmentation with $1 \leq D/D_{pad} \leq 2.5$, the parameterization can be:

$$[V]_{optimum}=0.45*D^2/(\mu\tau)_e*[\exp(D/D_{pad})]^{1.08}$$

However, there is another way to effect the fine tuning of electron trapping in the detectors of interest, and this is by controlling the properties of the detector material which are expressed by the $(\mu\tau)$ product.

In line with the above-mentioned general object of the present invention, the first one is to provide a new method for compensating for the effects of incomplete charge collection in room temperature solid state gamma and X-ray detectors. The second object is to provide a method of designing such an optimal detector. The third object will be to provide the detector per se, i.e. the one having improved spectroscopic characteristics owing to internal compensation for the effects of incomplete charge collection.

Equation (1) mathematically enables derivation of the optimal $(\mu\tau)_e$ of the detector material based on a predetermined value of the voltage applied to the detector:

$$[(\mu\tau)_e]_{optimum}=k/V*D^2*f(D/D_{pad}) \qquad (3)$$

Though adjusting the material properties say, in the crystal growth process, may seem to be an obvious mathematically derivable solution for achieving the above-described task in the detectors of interest, it has been neither realized nor described in the prior art with respect to such a purpose.

The inventors suggest to purposely select the detector crystal with electron trapping sites providing such electron trapping to produce the compensation effect overcoming the incomplete charge collection caused by the nearly complete hole trapping. It should be noted, however, that this conclusion contradicts to the commonly accepted approach, according to which the higher $(\mu\tau)_e$, the better the detector. The prevalent approach known in the art is that as many as possible electrons produced by interaction between a photon and the detector material must be collected by the pads.

However, there are reasons for selecting the detector material with more electron trapping sites rather than using a material with a higher $(\mu\tau)_e$ and lowering the applied voltage to obtain the desired amount of trapping. When X-rays or gamma-rays impinge uniformly a monolithic segmented pad detector, there exists a finite probability that the charge created by an interaction in the volume define close to the boundaries of one pad, may cause an induced charge at a neighboring pad. This effect is due to thermal diffusion of charge in a direction perpendicular to the electric field. The root-mean-square radius (RMS) of charge sharing near the segmented surface due to the charge diffusion is proportional to the thickness D of the detector, and inversely related to the square root of the applied voltage V. Therefore, for obtaining minimal crosstalk (i.e. minimal charge sharing between neighboring pads), it is accepted to operate the detector of interest at the highest voltage technically suitable therefor. According to equations (1) to (3), it is favorable to operate the described detector at an optimum high voltage when the value $(\mu\tau)_e$ is low.

The inventors' idea to compensate for the incomplete charge collection in the above-define detectors (i.e. the idea which was partially disclosed in the IL 120807 and is further developed in the present application) opens an absolutely different way to improve spectroscopic characteristics of the detectors, namely by controlled trapping of electrons.

The technical solution forming the basis of the present application could not, therefore, be arrived to before having learned the above-mentioned inventors' concept.

According to the first aspect of the present invention, there is provided a generalized method for compensating for the effects of incomplete charge collection of room temperature solid state gamma or X-ray detectors capable of operating at a detector voltage applied thereto, by causing controlled electron trapping.

In the preferred embodiment of the present invention, the detector mentioned in said method is a monolithic detector with segmented readout having a first common non-segmented electrode and a second electrode with segmented readout, said segmented readout comprising segmented elements.

According to a further embodiment, said monolithic segmented detector has the common electrode at negative bias and the segmented electrode at positive bias, preferably by placing the segmented elements at virtual ground and the common electrode at negative high voltage.

According to the second aspect of the present invention, there is provided a new version of the above general method for compensating for the effects of incomplete charge, comprising: providing of said controlled electron trapping by controlled modifying the electron mean path length $\lambda_e$, by means of selecting and further tuning the degree of electron trapping in the detector material, wherein:

$\lambda_e=(\mu\tau)_e V/D$;

$(\mu\tau)_e$—is the product reflecting the material electron mobility characteristics;

V—is the detector voltage

D—is the detector thickness.

According to the preferred version of the method, the controlled electron trapping in the detector of given thickness is provided by controlled modifying the electron mean path length $\lambda_e$ at a selected substantially high detector voltage, thereby ensuring said compensation while increasing the detector resolution and photopeak efficiency.

More particularly, the above method may comprise the following steps:

selecting said detector with a detector material having a substantially low value of $(\mu\tau)_e$, determining a maximal value of the detector voltage for said detector of given thickness, controlling said electron trapping by applying to the detector a voltage substantially close to said maximal voltage value and further tuning thereof, thereby obtaining optimal compensation.

The term "maximal voltage" should be understood as a voltage sufficient for keeping to minimum the charge shared among adjacent segmented elements, while not exceeding the value causing deterioration of the detector signal by leakage currents (and being definitely lower than the breakdown voltage). The term "substantially high voltage" is considered as a voltage close to the maximal.

As mentioned, after having selected the maximal voltage and the material with the pre-selected (rather high) electron trapping, the control is provided by tuning the voltage about the maximal value to obtain such a spectroscopic performance of the detector for which the output energy signal is independent of depth of interaction over most of the detector volume.

The above-mentioned value of a "substantially low $(\mu\tau)_e$" at the given maximal applied voltage can be determined either experimentally, or theoretically. It depends on the detector thickness, but has been found to be in the range from of about $8*10^{-4}$ cm$^2$/V to $3*10^{-3}$ cm$^2$/V.

Still further, for the theoretical determination of said substantially low $(\mu\tau)_e$, there is also provided a method of designing a room temperature solid state gamma or X-ray monolithic detector with segmented readout to be operated at a detector voltage applied thereto and being capable of optimally compensating for incomplete charge collection, the method comprising selecting a thickness D of the segmented monolithic detector and the dimension $D_{pad}$ of its segmented element, and determining an optimum degree of electron trapping by calculating the optimal electron mean path length $[\lambda_e]_{optimum}$, (based on the electrostatic theory and semi-empiric determination of factors) according to the following parameterization:

$$[\lambda_e]_{optimum}/D=k*f(D/D_{pad}).$$

The type of the function f depends on the detector's specific segmentation.

If the detector is being designed for a specific voltage, the method will further comprise the steps of:

selecting a maximal value V of the detector applied voltage for said detector, determining an optimum property $[(\mu\tau)_e]_{optimum}$ of electron trapping of the detector material (again, based on the electrostatic theory and semi-empiric determinations) according to the following parameterization:

$$[(\mu\tau)_e]_{optimum}=k/V*D^2*f(D)/D_{pad}).$$

For the pad segmentation, a convenient parameterization of the above equations has been found to be:

$$[(\mu\tau)_e]_{optimum}=2.4*D^2/V(D/D_{pad}-0.4).$$

$$[\lambda_e]_{optimum}/D=2.4*(D/D_{pad}-0.4).$$

For the pad segmentation with $1 \leq D/D_{pad} \leq 2.5$, the following parameterization is given:

$$[(\mu\tau)_e]_{optimum}=0.45D^2/V(e^{D/Dpad})^{1.08}.$$

$$[\lambda_e]_{optimum}/D=0.45*(\exp^{D/Dpad})^{1.08}.$$

As above, the maximal voltage is such a voltage which is sufficient for keeping to minimum the charge shared among adjacent segmented elements, while being lower than the breakdown voltage.

It should be mentioned that, in practice, the optimal electron trapping property, upon being determined as described above, can be obtained by a controlled dopant activation. For example, the controlling of the value $(\mu\tau)_e$ of a material can be performed during the crystal growth process.

For CdTe and CdZnTe monolithic segmented pad detectors, where $(\mu\tau)_e>>(\mu\tau)_h$ and the thickness is on the same order of or larger than the pad side dimension, the induced charge is mainly due to electrons. This is especially true for CdZnTe detectors where $(\mu\tau)_e \sim 100 \, (\mu\tau)_h$. The electron lifetime $\tau_e$ can be controlled by the doped impurity concentration. Example 1. For chlorine (Cl) doped THTM grown CdTe p-type crystals, the electron lifetime increases with the reduction of Cl concentration. On the other hand, the resistivity increases with the Cl concentration. Since the resistivity determines the leakage current of the detector or its energy resolving power, it is necessary, for detectors with good spectroscopic characteristics, to select materials with high resistivity. In order to reach a lower value of $(\mu\tau)_e$, i.e. the increased electron trapping in the material, it can be controlled by increasing the Cl concentration (leading also to a higher resistivity).

Example 2. For indium (In) doped CdTe material, the electron lifetime decreases with the increase of the In concentration. A desired low value of $(\mu\tau)_e$ can therefore be achieved by the controlled increase of the In doping concentration. (The resistivity of the material will also increase).

It should be mentioned, that the two above examples are not unique and are to be considered non-binding.

Based on the above findings, materials for the detector of interest may have such properties which have never been considered desired for producing spectroscopic detectors.

Typically, the quality of the detector is parameterized by the quantity $(\mu\tau)_e$. In CdZnTe detectors, the quantity $(\mu\tau)_e$ has been found to vary anywhere from, typically, $4\times10^{-4}$ cm$^2$/V up to $10^{-2}$ cm$^2$/V. Hole trapping is at least a factor of 100 more severe than that for electrons, and so may reach values of $10^{-5}$ or lower.

The degree of electron trapping required to compensate for the totally trapped holes in a detector with segmented readout elements on the positive electrode depends on the ratio of dimension of segmented elements to detector thickness. By way of a non-binding example, a detector with pad segmentation, with pad size of 2 mm×2 mm and detector thickness of 3 mm, optimum compensation occurs for $\lambda_e$=6.7 mm. To achieve this amount of electron trapping, a detector 3 mm thickness with $(\mu\tau)_e$=8×10$^{-4}$ cm$^2$/V will require an applied electric field of E=830 V/cm, or V=250 volts, while a similar detector but with $(\mu\tau)_e$=8×10$^{-3}$ cm$^2$/V will require E=83 V/cm, or V=25 volts. For a typical room temperature solid state detector operating at an applied voltage that results in such relatively sizable amount of electron trapping, hole trapping is severe and the holes can be comfortably assumed to be totally trapped.

In light of the above, an additional aspect of the present invention will be a monolithic room temperature solid state gamma or X-ray detector, per se, with segmented readout, intended for operation at a detector voltage applied thereto, having a thickness D, and a segment's dimension $D_{pad}$, the detector being characterized in that its electron mean path length $[\lambda_e]$ is substantially close to $[\lambda_e]_{optimum}$ described by the following equation:

$$[\lambda_e]_{optimum}/D=k*f(D/D_{pad}),$$

thereby ensuring compensation for the effects of incomplete charge collection.

For the detector with pad segmented readout the above equation will read substantially as follows:

$$[\lambda_e]_{optimum}/D=2.4*(D/D_{pad}-0.4),$$

and for the detectors having $1 \leq D/D_{pad} \leq 2.5$, a convenient parameterization of the above equations has been found to be:

$$[\lambda_e]_{optimum}/D=0.45*(e^{D/Dpad})^{1.08}.$$

According to a specific embodiment of the detector designed for operation at a detector voltage V, the detector is characterized in that its electron trapping property $[(\mu\tau)_e]$ is essentially close to $[(\mu\tau)_e]_{optimum}$ described by the following equation:

$$[(\mu\tau)_e]_{optimum}=k/V*D^2*f(D/D_{pad}),$$

thereby ensuring compensation for the effects of incomplete charge collection.

For the detector wherein one of the electrodes of the detector has the pad segmentation, the above-mentioned equation will be:

$$[(\mu\tau)_e]_{optimum}=2.4*D^2/V*(D/D_{pad}-0.4)$$

In an analogous manner, for the detector with the pad segmentation where $D/D_{pad}<2.5$, the parameterization is essentially as follows:

$$[(\mu\tau)_e]_{optimum}=0.45*D^2/V*(e^{D/Dpad})^{1.08}.$$

It should be appreciated, that the factors (coefficients) used in the above equations are semi-empirical; an error of about ±10% in the values thereof is therefore tolerable.

The spectrum obtained by the detector at the optimum $\lambda_e$, (i.e. either at the optimum V or at the optimum $(\mu\tau)_e$) was found typically far superior to that obtained at values of $\lambda_e$ being higher or lower than the optimum $\lambda_e$. As a result of the balance between the effect of the trapped holes in one direction and the partial trapping of the electrons in the other direction, a photon energy spectrum is obtained which is not dependent on the depth of the photon interaction over most of the detector thickness. Segmented readout elements are preferred over a single element detector since the segmentation provides a linear region in induced signals which extrapolates to a finite value at maximum depth of interaction. The ratio between the dimension of the readout element, and the thickness of the detector, determines how much electron trapping will be necessary for optimum compensation.

Typically, each segmented element of said segmented elements is connected to individual charge sensitive electronics and wherein an induced signal is recorded by said charge sensitive electronics as a result of an interaction of a gamma or X-ray with said detector.

Generally, a measurement is made by noting a largest positive value of said induced signal.

Typically, said segmented elements are rectangular elements (pads, strips or the like).

Further typically, said electrode with segmented readout is at a positive bias.

Still further typically, each segmented element of said electrode with segmented readout is at virtual ground and said common non-segmented electrode is at negative voltage.

By one embodiment, applying said method for compensating the incomplete charge collection to said detector results in a substantially optimum spectrum characterized by a substantially optimum spectroscopic Figure Of Merit (FOM).

Typically, said substantially optimum FOM is given by:

$$FOM = \frac{(N_{peak}/N_{total})}{FWHM\%},$$

where,
$N_{peak}$=integrated number of counts at peak of spectrum due to a given photon interaction in the detector,
$N_{total}$=total number of counts due to said given photon interaction in the detector, and
FWHM%=Full Width Half Maximum of said peak of said spectrum in percentage. In such a case, a substantially optimal FOM is of the order of at least 1.

Optionally, said FOM is given by:

$$FOM = \frac{(Peak/Valley)}{FWHM\%},$$

where:
Peak=height of peak of spectrum due to a given photon interaction in the detector,
Valley=height of the valley of said spectrum behind the peak due to said given photon interaction in the detector, and
FWHM%=Full Width Half Maximum of said peak of said spectrum in percentage.

In such a case, a substantially optimal FOM is of the order of at least 0. 0.1.

There is also provided in accordance with the present invention a portably operable detector, wherein said detector voltage that substantially compensates for incomplete charge collection is provided for by a battery.

Further in accordance with the present invention there is provided an array of room temperature solid state gamma or X-ray detectors; said array of detectors comprising a plurality of individual detectors, each individual detector comprising an individual detector material of a given detector material quality and having an individual thickness; wherein a separate detector voltage that substantially compensates for incomplete charge collection is applied to each said individual detector; said separate detector voltage causing controlled electron trapping in each said individual detector. Generally, each of said individual detectors has a first common non-segmented electrode and a second electrode with segmented readout, said segmented readout comprising segmented elements.

If desired, said detector array is partitioned into sections, each section containing at least one individual detector and wherein each of the detectors belonging to a given section comprises substantially the same detector material quality and substantially the same thickness.

Generally, substantially the same detector voltage that substantially compensates for incomplete charge collection is applied to each said individual detector in a given section causing controlled electron trapping to essentially the same degree in each said detector belonging to said given section.

If desired, said sections consisting of detectors of similar material are arranged in parallel rows, and wherein each row consists of detectors of comparable quality.

Preferably, substantially the same detector voltage is applied to the each of the detectors in a given section of the array, whereby incomplete charge collection is compensated for to substantially the same degree for each detector in a given section by controlling to essentially the same degree the electron trapping in each detector of a given section.

Further preferably, said parallel rows are arranged according to decreasing detector voltage and an appropriate voltage divider chain across the parallel rows maintains substantially the same applied detector voltage on each detector in a given row.

BRIEF DESCRIPTION OF THE DRAWINGS

For a better understanding the invention will now be described, by way of example only, with reference to the accompanying drawings in which.

DETAILED DESCRIPTION OF THE INVENTION

Theoretical Background

Figure 1A:
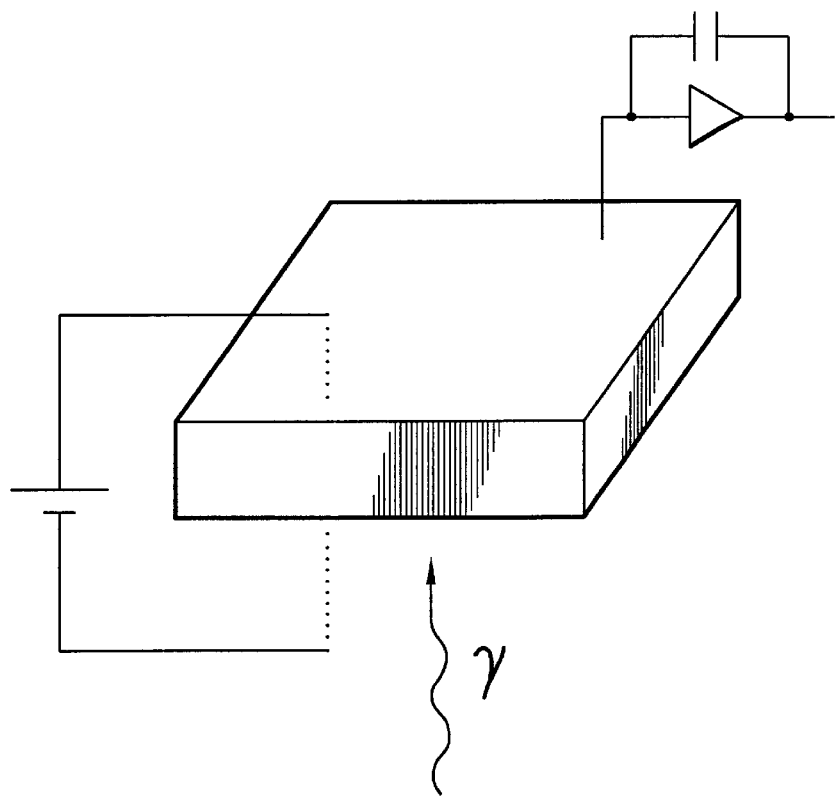
FIG. 1A shows a schematic illustration of the basic configuration of a solid state gamma or X-ray single element detector.

The description of the invention will be preceded by a brief description of the physical processes occurring as a result of a gamma or X-ray interaction with a room temperature solid state detector. The basic configuration of a solid state gamma or X-ray detector is shown in FIG. 1A for a single element detector. The detector has electrodes on opposite faces, and across the electrodes a voltage is applied. The gamma or X-ray beam is usually incident on the negative electrode, while the positive electrode usually is connected to the readout (charge sensitive or charge integrating) electronics. The room temperature detector material can be CdTe, CdZnTe, HgI$_2$, GaAs, and others.

Assume, without limiting the generality, a gamma or X-ray incident on a solid state detector is totally absorbed via the photoelectric effect. It produces secondary ionizing radiation which generate $N_0$ electron—hole pairs within very close vicinity to the point of interaction (on order of 50–100 microns). The number of pairs produced, $N_0$, is directly proportional to the energy of the incident gamma or X-ray. In the presence of the applied electric field, the electron and hole charge carriers drift to the positive and negative electrodes, respectively. For a solid state detector with complete charge collection, measuring the total electron and hole induced charge signals on the electrodes provides spectroscopic information on the incident gamma or X-ray, since the total induced charge, which is equal to $qN_0$, is proportional to the number of drifting charge carriers.

Unfortunately, all room temperature solid state detectors with medium to high atomic number, including the ones mentioned above, suffer from incomplete charge collection. As a result of charge trapping, not all the charge carriers are collected, thereby, the induced charge is less than $qN_0$. For most room temperature detectors, a high rate of hole trapping is exhibited, and thereby the induced charge for a monoenergetic gamma or X-ray source will depend on the depth of interaction in the detector. In the limit of total electron collection and complete hole trapping, the decrease in induced charge will linearly depend on the depth of the gamma or X-ray interaction (for gamma/X-rays incident on the negative electrode). For example, interaction at midpoint between negative and positive electrode will result in only half of the maximum possible induced charge. It is therefore common to operate these detectors at highest allowable applied voltage so that the amount of trapping of the charge carriers, especially the hole carriers, would be as little as possible.

The following is a brief description of the phenomenology of the drift and trapping of the electron and hole charge carriers in semi-insulating material. The velocity of the charge carriers is parameterized by the equation v=$\mu$E, where $\mu$ is the mobility of the charge carrier and E is the applied electric field in volts/cm, where E can be expressed as V/D, where V is the applied voltage and D the detector thickness. In CdZnTe, the mobility for electrons is ~1000 cm$^2$/V-sec, while for holes the mobility is a factor of 20 lower. The mean free path for a carrier is given by $\lambda$=$(\mu\tau)$E, so increasing the applied electric field results in a proportionally longer path length for the charge carrier in the material. In CdZnTe, $(\mu\tau)_e$ varies from about 5×$10^{-4}$ to $10^{-2}$ cm$^2$V, while for holes $(\mu\tau)_e$ is at least a factor of 100 smaller. The product $(\mu\tau)$ of a specific charge carrier can be obtained by illuminating the detector on the side of the electrode opposite to the electrode that the charge carrier will be collected on with a low-penetrating ionizing source. For example, the value for $(\mu\tau)_e$ can be obtained by measuring the pulse height as a function of applied voltage for an alpha source or low energy gamma source incident on the negative electrode, and fitting the results to the Hecht equation, which is given by:

$$Q = Q_0 \times \frac{(\mu\tau)_e}{D} \times \left[1 - e^{-\left(\frac{D}{(\mu\tau)_e E}\right)}\right]$$

and extracting the value for $(\mu\tau)_e$.

Figure 2A:
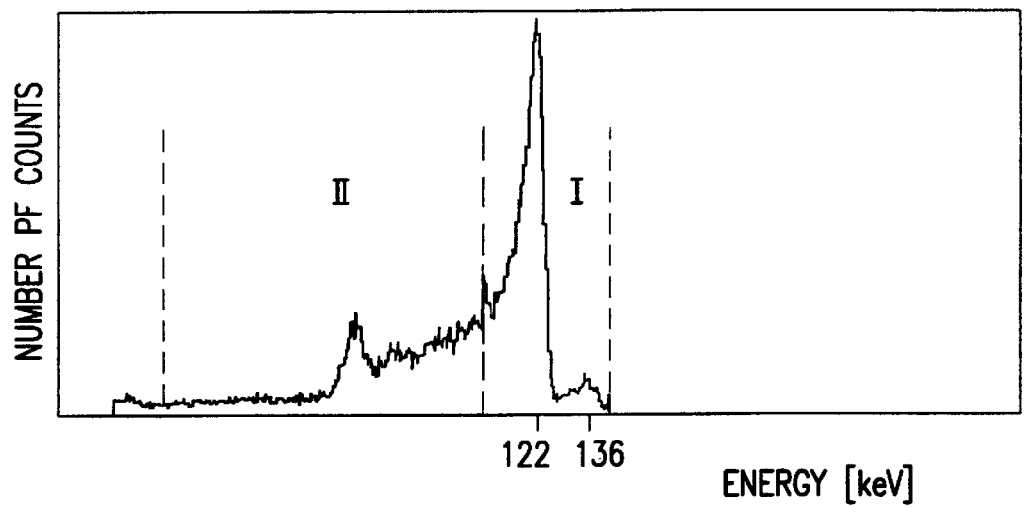
FIG. 2A shows the spectral response, for a $^{57}$Co source, of a single element CdZnTe detector with very good spectroscopic properties operated at a detector voltage of 500 V.
Figure 2B:
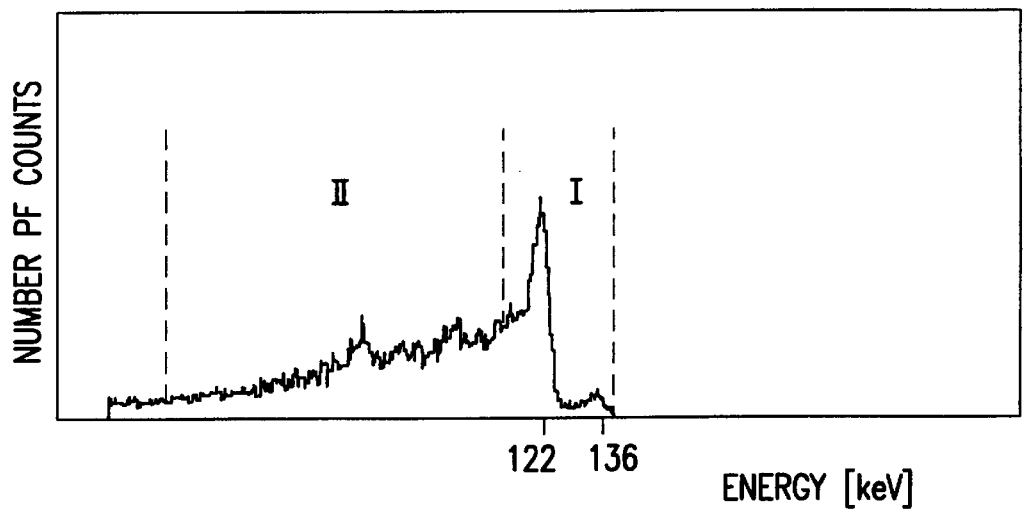
FIG. 2B shows the spectral response, for a $^{57}$Co source, of a single element CdZnTe detector fair spectroscopic properties operated at a detector voltage of 500 V.

Two good examples of the effects of incomplete charge collection can be seen in FIGS. 2A and 2B, which show the spectral response of two CdZnTe detectors to a $^{57}$Co source, with a line at $E_\gamma$=122 keV a less intense line at $E_\gamma$=136 keV. Both detectors were 3 mm in thickness and were operated at V=500 volts. Region I contains interactions events which produce signals in the photopeak, while region II contains events which result in incomplete charge collection. For a very good spectroscopic detector, shown in FIG. 2A, the number of interaction events that fall in region II, i.e. the incomplete region, is as large as the number of events in region I, i.e. the photopeak region. For a fair spectroscopic detector, shown in FIG. 2B, the number of events that fall in the incomplete region is more than double those that fall in the photopeak region. It should be noted that in most cases, it is the poor charge transport properties of the hole carriers which brings rise to incomplete charge collection, while the electrons suffer relatively modest charge trapping. This is especially true for CdZnTe detectors, which exhibit very good charge transport properties for the electrons, but rather poor charge transport properties for the holes.

The present invention provides a method for compensating for the effects of incomplete charge collection due to the trapped holes while at the same time improving spectroscopic performance. The effect of complete hole trapping, which results in reduced induced signal as the depth of photon interaction increases, can be offset by properly tuning the amount of electron trapping, since the total amount of collected electrons diminishes as the electron path length increases, or for interactions which are closer to the front of the detector. This fine tuning to compensate effect of the completely trapped holes with mild trapping of the electrons can be performed by selecting an appropriate material with a considerable electron trapping parameter and adjustment of the detector applied voltage. As a result of the balance between the effect of the trapped holes in one direction and the partial trapping of the electrons in the other direction, a photon energy spectrum is obtained which is not dependent on the depth of the photon interaction over most of the detector thickness.

Experimental Results

The method of the present invention is most effective for a detector with segmented readout. This type of detector is also referred to as a monolithic detector array, since the detector material itself is monolithic in nature, but one of the electrodes, preferably the positive electrode, is segmented. In a preferred embodiment of the invention, the positive electrode is segmented, with each segmented element preferably connected to a charge sensitive amplifier. Preferably, the negative electrode (common) is connected to a negative voltage source, while each of the segmented elements on the positive electrode is held at virtual ground. For best results, the gamma or X-ray radiation is incident on the negative electrode. Typically, but not necessarily, the segmented elements are square. Square segmented elements are also known as pads.

Figure 1B:
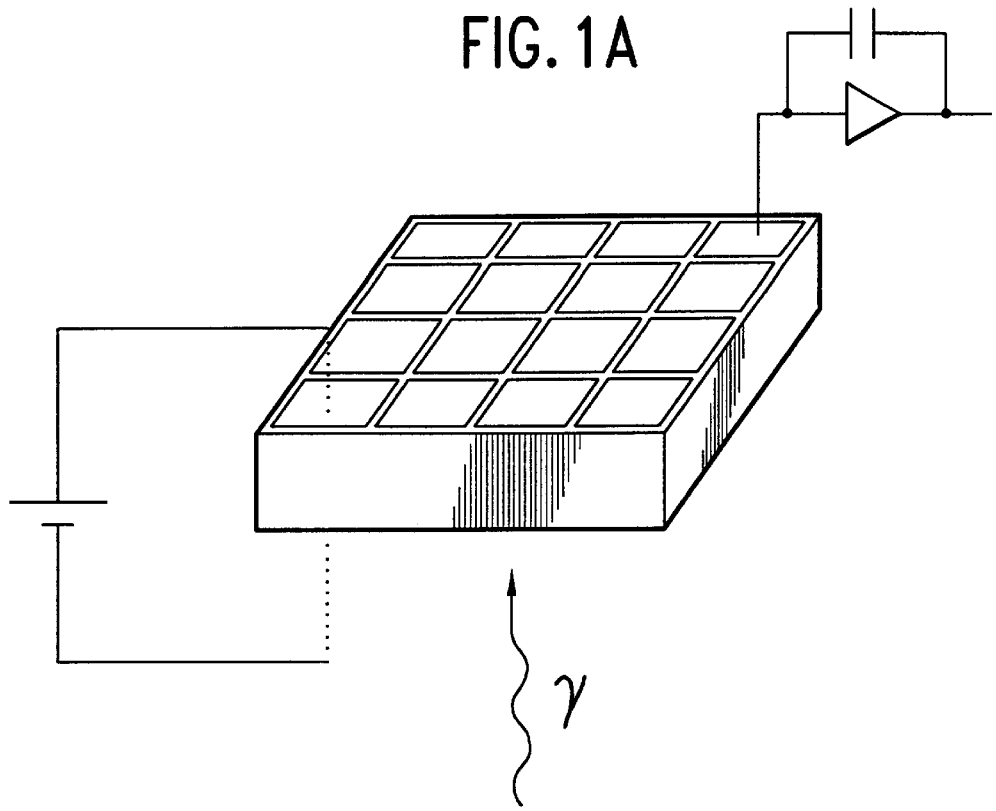
FIG. 1B shows a schematic illustration of a segmented monolithic solid state gamma or X-ray detector.

FIG. 1B shows a schematic illustration of a segmented monolithic detector, although other monolithic detector sizes and segmentation are possible. Measurements were performed on a detector of the type shown in the figure. The dimensions of the detector were 8.4 mm×8.4 mm, with thickness 3 mm. The positive electrode was segmented with 16 pads forming a 4×4 square array. The pads were 2 mm×2 mm in size. The spacing between adjacent pads was 0.1 mm. Each pad element was connected to its own charge sensitive electronics.

Two detectors with the above geometry were used. The detectors differed only in their material properties:

detector A was characterized by $(\mu\tau)_e=8\times10^{-4}$ cm$^2$/V, detector B was characterized by $(\mu\tau)_e=8\times10^{-3}$ cm$^2$/V.

Figure 3:
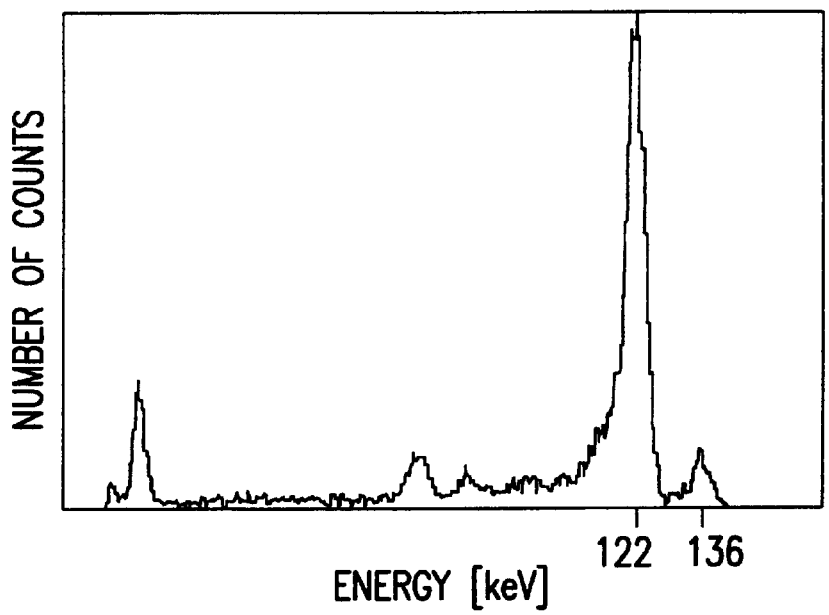
FIG. 3 shows the spectral response, for a $^{57}$Co source, of a segmented CdZnTe detector characterized by $(\mu\tau)_e$=8×$10^{-4}$ cm$^2$/V, operated at an optimum detector voltage of 250 V.

FIG. 3 shows the energy spectrum obtained taken with detector A consisting of detector material with rather large electron trapping. The detector was operated at room temperature using a $^{57}$Co source at an optimum applied voltage of 250 Volts. Attention is drawn to the very sharp peaks for the 122 keV and the 136 keV lines. The energy resolution of these peaks is better than 4% FWHM, while the peak to valley of the 122 keV peak is better than 20 to 1. The results obtained are an improvement on those obtained in the prior art for solid state detector at room temperature operation. The spectrum deteriorates drastically for applied voltages below 150 volts, or above 350 volts.

Figure 4:
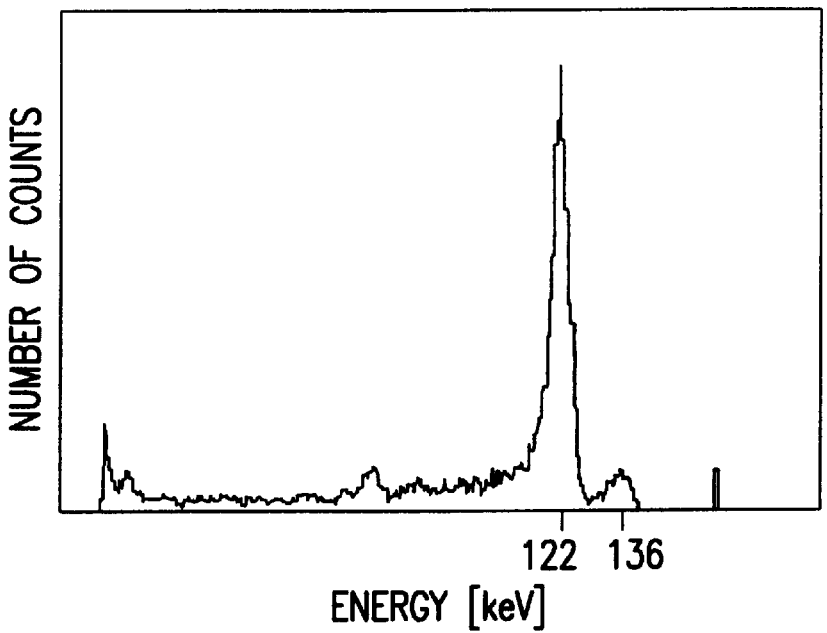
FIG. 4 shows the spectral response, for a $^{57}$Co source, of a segmented CdZnTe detector characterized by $(\mu\tau)_e$=8×$10^{-3}$ cm$^2$/V, operated at an optimum detector voltage of 30 V.

FIG. 4 shows the energy spectrum obtained taken with detector B manufactured from a detector material with low electron trapping. The detector was operated at room temperature using a $^{57}$Co source at an optimum applied voltage of 30 Volts (which is less preferred from the point of view of charge sharing between adjacent segmented elements). Though, good results for the spectrum were obtained at the optimum applied voltage. The spectrum deteriorated drastically for applied voltages below 20 volts or above 40 voltage.

It should be noted that the optimum applied voltages used to obtain the above results for the spectrum of solid state detectors at room temperature is dependent on the material properties of the detector, for a detector of given geometry. This is not surprising since detector A has only fair charge transport properties for the electrons, with $(\mu\tau)_e=8\times10^{-4}$ cm$^2$/V, while segmented detector B has excellent charge transport properties for electrons, an order of magnitude better than detector A, with $(\mu\tau)_e=8\times10^{-3}$ cm$^2$V. It should be also be noted that at the respective operating voltages, 250 volts for detector A and 30 volts for detector B, hole mobility is very low and thereby hole trapping is very severe.

Both detector A and detector B have very similar electron mean free paths at their respective optimum applied voltages. If a voltage drop of ~5 volts on the contacts of the electrodes is assumed, then for both detectors the electron mean free path is given by $\lambda_e=(\mu\tau)_e E=6.7$ mm. Varying the applied voltage varies the parameter $\lambda_e$. Varying the applied voltage around the optimum value over which both detectors still give good spectroscopic response is found to be equivalent to the range of values 5.5 mm<$\lambda_e$<8 mm, for the parameter $\lambda_e$. Over this range, the hole carriers can be safely assumed to be totally trapped in both detectors. Similar results have been found in other detectors with varying values of $(\mu\tau)_e$ and correspondingly different optimum voltages required.

The above results indicate that a subtle compensation effect is responsible for the excellent spectroscopic characteristics observed in detectors A and B at room temperature. It will be shown below that this effect is due to a careful balance between the effects of complete hole trapping on the one hand, and a slight amount of electron trapping on the other hand. Theoretical parametrization based on electrostatic theory will be given. Simulations based on the equations provide very good agreement with measurements, both on a qualitative and quantitative basis, and serve as a basis for tuning the optimum voltage on a detector when the quantity $(\mu\tau)_e$ is known.

It is sufficient to measure only the induced charge from those readout elements, over which electrons are actually collected. Occasionally, an X-ray or gamma interaction may occur between two adjacent readout elements, and electrons would be collected on both readout elements. For these cases, readout of the signals from both readout elements would be necessary for full spectroscopic reconstruction. It is therefore preferable to operate the detector at sufficiently high applied voltage so that the amount of events with charge sharing among two adjacent segmented elements would be insignificant. In such a case, there would be required only the signal from the segment which registered the largest signal. Alternatively, if the applied voltage is not sufficiently high, whether due to the voltage breakdown limitation or a desire to effect optimal compensation for a detector material with low amount of electron trapping, then the signal from a number of segments would be required for events in which the charge sharing occurred.

Theoretical Results

Theoretical calculations for gamma and X-ray interactions in segmented detectors must take into account the changes in the spatial distribution of the induced charge on the segmented electrode during the drift of the electron and hole charge carriers. Since the velocity of the electron and hole charge carriers is non-relativistic, electrostatic theory is sufficient for this application. An intuitive but theoretically rigorous approach is via the method of images, a technique which can be found in most textbooks on electromagnetism (see, for example, J. D. Jackson, *Classical Electrodynamics*, second edition, John Wiley Sons, New York, 1957; O. D. Kellogg, *Foundations of Potential Theory Ungar*, New York, 1929).

Results of Monte-Carlo simulations for detectors A and B based on solution to the electrostatic equations will be given. The simulation includes the geometry of the detectors and of the gamma or x-ray interaction. The electron mean free path $\lambda_e$ serves as a parameter. Complete hole trapping is assumed.

FIGS. 5(A,B), 6(A,B) and 7(A,B), discussed in more detail below, show the results of theoretical calculations performed for gamma rays of energy $E_\gamma$ 122 keV (=$E_0$) interacting with a monolithic detector of thickness D=3 mm segmented into pads dimensions 2 mm×2 mm, with complete hole trapping assumed.

Figure 5B:
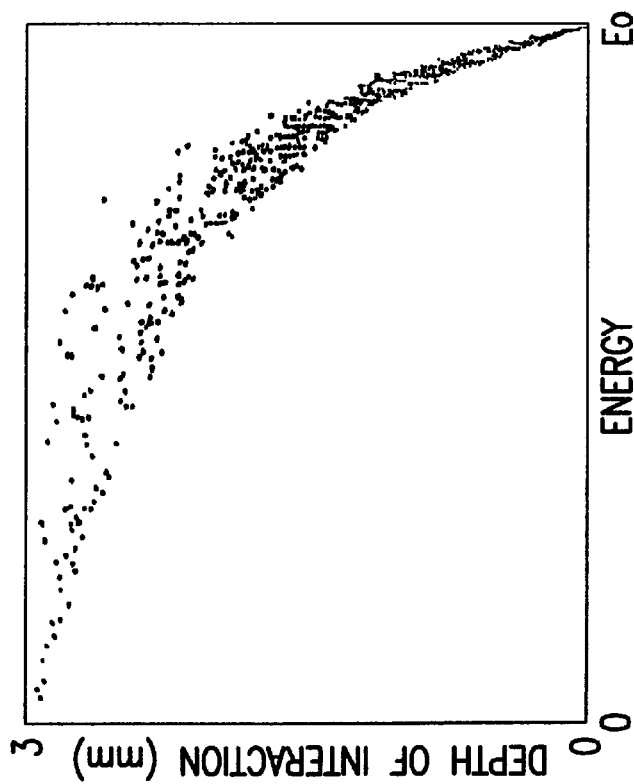
FIG. 5B shows a scatter plot of the calculated energy, for $E_0$=122 keV, as a function of the depth of interaction of a segmented monolithic solid state detector with no electron trapping.
Figure 5A:
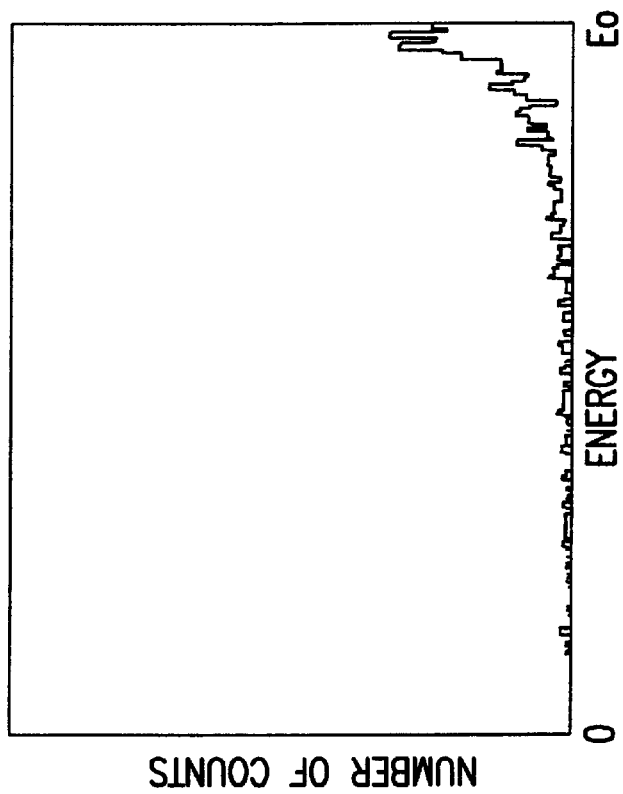
FIG. 5A shows the calculated energy spectrum, for $E_0$=122 keV, as a histogram of the total induced charge on the pad registering the maximum positive signal of a segmented monolithic solid state detector with no electron trapping.
Figure 6B:
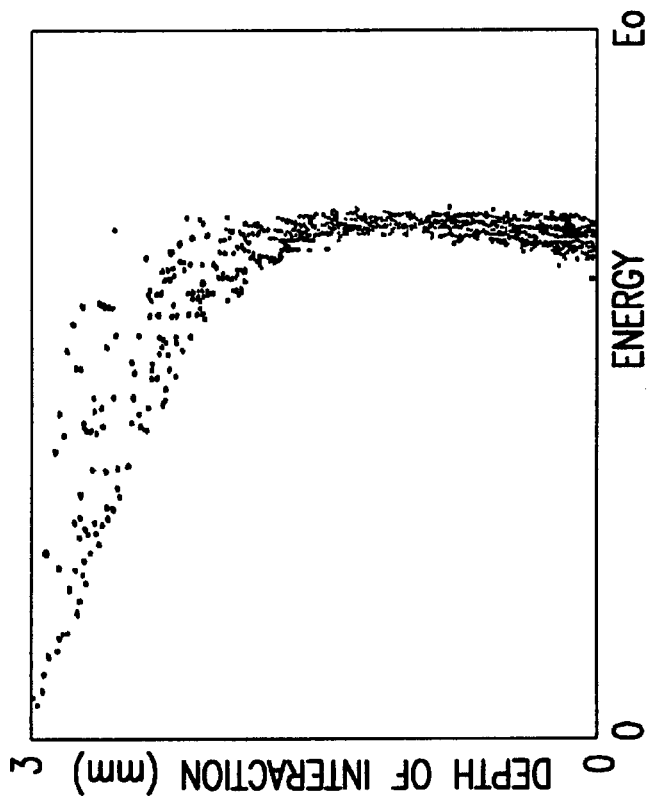
FIG. 6B shows a scatter plot of the calculated energy, for $E_0$=122 keV, as a function of the depth of interaction of a segmented monolithic solid state detector with optimal electron trapping.
Figure 6A:
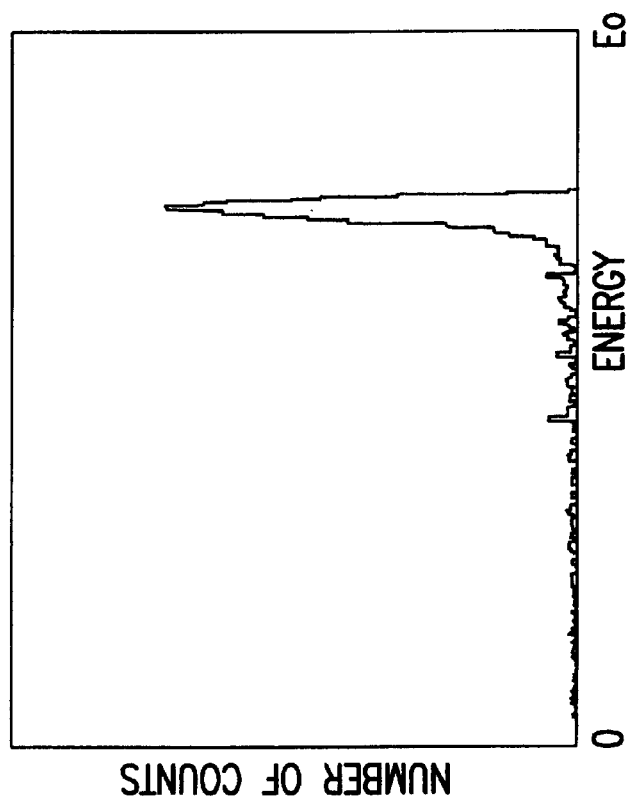
FIG. 6A shows the calculated energy spectrum, for $E_0$=122 keV, as a histogram of the total induced charge on the pad registering the maximum positive signal of a segmented monolithic solid state detector with optimal electron trapping.
Figure 7B:
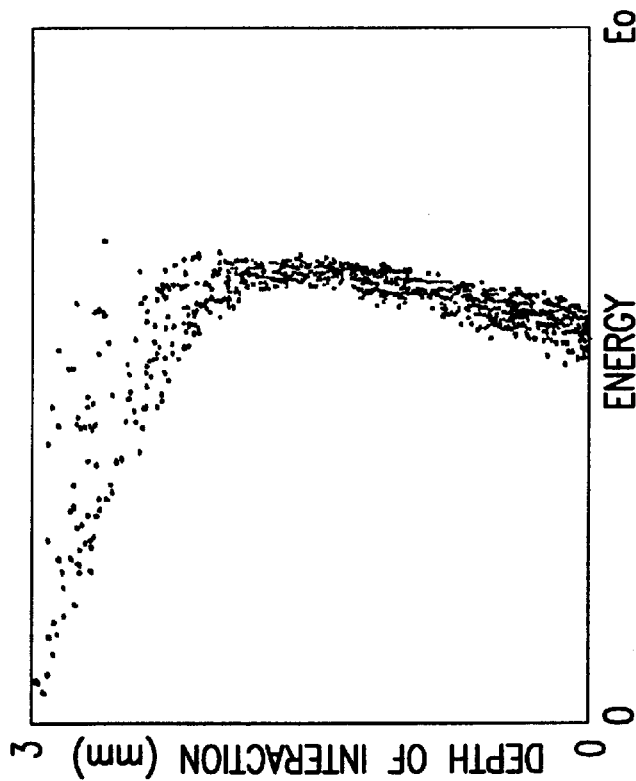
FIG. 7B shows a scatter plot of the calculated energy, for $E_0$=122 keV, as a function of the depth of interaction of a segmented monolithic solid state detector with electron trapping greater than the optimal value.
Figure 7A:
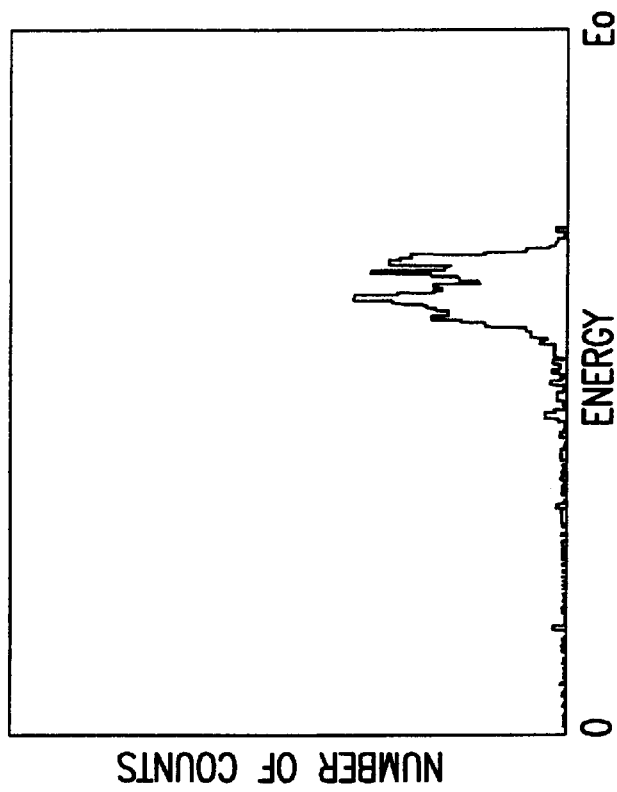
FIG. 7A shows the calculated energy spectrum, for $E_0$=122 keV, as a histogram of the total induced charge on the pad registering the maximum positive signal of a segmented monolithic solid state detector with electron trapping greater than the optimal value.

FIGS. 5A, 6A and 7A show the calculated energy spectrum, E, as a histogram of the total induced charge on the pad registering the maximum positive signal. FIGS. 5B, 6B and 7B show a calculated scatter plot of the energy (the total induced charge on the pad registering the maximum positive signal) as a function of the depth of interaction, t.

Attention is first drawn to FIGS. 5A and 5B showing, respectively, the calculated energy spectrum and the scatter plot with no electron trapping. It should be noted in FIG. 5B that there is a region (between t=0 mm to approximately t=2 mm) in which the induced charge decreases linearly with the depth of interaction. It is in this region that a modest amount of electron trapping can compensate for the effect of complete hole trapping. Since this linear region interpolates to a finite value, there is one optimum value of the parameter $\lambda_e$ which gives the best results. Since there is no electron trapping in this case there is also no compensation for hole trapping.

Attention is now drawn to FIGS. 6A and 6B showing, respectively, the calculated energy spectrum and the scatter plot with optimal electron trapping. These results were obtained by optimizing $\lambda_e$ so as to give the best spectroscopic histogram for the induced charge. In FIG. 6A, a distinct peak of about 4% FWHM resolution appears in the induced charge spectrum, with about 82% of the interaction events in the peak. On comparing FIG. 6B with FIG. 5B it can be seen that in FIG. 6B the linear region in the scatter plot has been made vertical. This has been achieved by using the correct amount of electron trapping, so that the projection onto the x-axis gives the sharp peak seen in the induced charge spectrum in FIG. 6A. It should be noted that the optimum value for $\lambda_e$ in these theoretical calculations is 6.7 mm, the same value as determined experimentally for detectors A and B (FIGS. 3 and 4). The optimal electron trapping provides precise compensation for hole trapping.

FIGS. 7A and 7B show, respectively, the calculated energy spectrum and the scatter plot with electron trapping greater than the optimal value. The results were obtained by taking $\lambda_e$=4 mm. As can be seen the induced charge spectrum has drastically deteriorated and the linear region in the scatter plot is no longer vertical. The reason for these poor results is that the electron trapping has been taken to be greater than the optimal electron trapping value and this value of electron trapping provides over-compensation for the hole trapping. Effects of deterioration of spectra for no electron compensation (V>$V^{optimum}+_\Delta V$) or overcompensation (V<$V^{optimum}-_\Delta V$) as shown by the theoretical calculations were also observed experimentally.

Theoretical calculations show that the optimal value for $\lambda_e$ for a particular configuration of a segmented detector depends quite strongly on the ratio of detector thickness to segment dimension, or $D/D_{pad}$, where $D_{pad}$ is the size of the pad. For a given segmented detector geometry, there is a range of electron mean free paths, $\lambda_e$, which would give close to optimum results. For example, for a segmented detector of 3 mm thickness with 2 mm×2 mm pads, the optimum value of $\lambda_e$ is 6.7 mm, with almost comparably good results for 5.5<$\lambda_e$<8 mm. This result is also born out experimentally.

Figure 8:
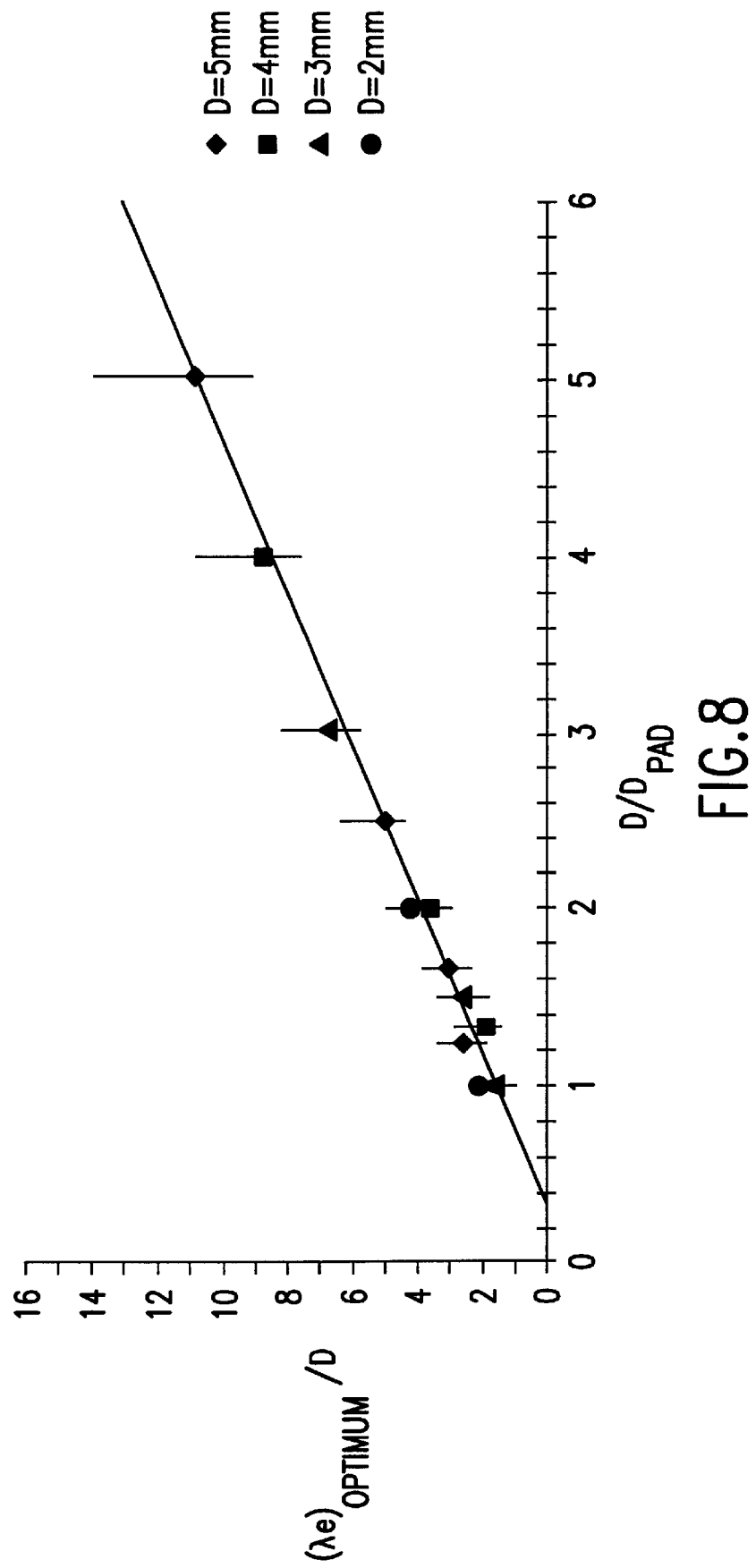
FIG. 8 shows the dependence of optimum electron mean free path(divided by the detector thickness) on the segmented detector geometry as obtained from theoretical calculations using Monte-Carlo simulations based on solution to electrostatic equations.

FIG. 8 shows the dependence of the optimum electron mean free path divided by the detector thickness, or $(\lambda_e)_{optimum}/D$, on the segmented detector geometry. The graph for $(\lambda_e)_{optimum}/D$ shown in the figure is obtained from theoretical calculations using Monte-Carlo simulations based on solution to electrostatic equations and semi-empiric determinations, which give rise to the following parametrization:

$$[\lambda_e]_{optimum}/D=2.4*(D/D_{pad}-0.4),$$

For the interval $1 \leq D/D_{pad} \leq 2.5$ an exponential dependence can be used (not shown in the Figure):

$$[\lambda_e]_{optimum}/D=0.45*(e^{D/Dpad})^{1.08}.$$

Again, the values of the semi-empiric coefficients should be considered to comprise an error of at least ±10%.

To simplify this graph, normalized parameters are used, and what is plotted is the quantity $[(\lambda_e)_{optimum}/D]$ as a function of $D/D_{pad}$. The error bars represent approximately the range over which close to optimum results are obtained. FIG. 8, as well as the equations above, can be used as a reference for determining the optimum applied voltage for optimum compensation effect for a detector with a known value for $(\mu\tau)_e$, or vice versa.

What is claimed is:

1. A method for detecting gamma or X-ray radiation with a room temperature solid state gamma or X-ray detector having an electron trapping parameter $(\lambda\tau)_e$ and adapted to operate in a detector voltage V, said method comprising the steps of:

(a) selecting at least one of $(\mu\tau)_e$ and V so as to tune the electron trapping to optimally compensate for the incomplete charge collection;

(b) detecting said gamma or X-ray radiation with a room temperature solid state gamma or X-ray detector having the selected $(\mu\tau)_e$ and/or V.

2. A method in accordance with claim 1, wherein said detector is a monolithic detector with segmented readout having a first common non-segmented electrode and a second electrode with segmented readout, said segmented readout comprising segmented elements.

3. A method in accordance with claim 2, wherein each segmented element of said segmented elements is connected

17 to individual charge sensitive electronics and wherein an induced signal is recorded by said charge sensitive electronics as a result of an interaction of a gamma or X-ray with said detector.

4. A method in accordance with claim 3, wherein a measurement is made by noting the largest positive value of said induced signal.

5. The method in accordance with claim 2, wherein said segmented elements are rectangular elements.

6. A method in accordance with claim 2, wherein said electrode with segmented readout is at a positive bias.

7. A method in accordance with claim 2, wherein each segmented element of said electrode with segmented readout is at virtual ground and said common non-segmented electrode is at negative voltage.

8. A method according to claim 2, wherein $(\mu\tau)_e$ and V are selected by a method comprising:
(a) selecting the thickness D of the segmented monolithic detector and the dimension $D_{pad}$ of its segmented element;
(b) determining the optimal electron free path length $(\lambda_e)_{optimum}$ for the selected D and $D_{pad}$ according to the following parameterization:

$$(\lambda_e)_{optimum}/D = 2.4(D/D_{pad} - 0.4)$$

(c) selecting a detector voltage V and a detector material having an electron trapping parameter $(\mu\tau)_e$ that together ensure that the electron free path length $\lambda_e$ of the detector will be essentially equal to $(\lambda_e)_{optimum}$.

9. A method according to claim 8, wherein said parameterization is replaced by the following parameterization:

$$[(\mu\tau)_e]_{optimum} = 0.45 D^2 / V(e^{D/Dpad})^{1.08}.$$

10. A method according to claim 1, wherein $[(\mu\tau)_e]$ is given and the detector voltage V is selected so as to tune the electron trapping to optimally compensate for the incomplete charge collection.

11. A method in accordance with claim 10, wherein said detector is a monolithic detector with segmented readout having a first common non-segmented electrode and a second electrode with segmented readout, said segmented readout comprising segmented elements.

12. A method in accordance with claim 11, wherein said detector voltage is an optimal detector voltage whereby optimal compensation of said incomplete charge collection is obtained and wherein said optimal detector voltage, $V^{optimum}$, is obtained from electrostatic theory, and substantially given by the following parameterization:

$$V^{optimum} = 0.45 * D/(\mu\tau)_e (e^{D/Dpad})^{1.08}.$$

13. A method in accordance with claim 11, wherein said detector voltage is an optimal detector voltage whereby optimal compensation of said incomplete charge collection is obtained and wherein said optimal detector voltage, $V^{optimum}$, is obtained from electrostatic theory, and substantially given by the following parameterization:

$$V^{optimum} = 2.4 * D/(\mu\tau)_e (D/Dpad - 0.4).$$

14. A method in accordance with claim 12, wherein said detector voltage is given by $V^{optimum} \pm \Delta V$ wherein $\Delta V$ is of the order of $\pm 30\%$ of $V^{optimum}$.

15. A method in accordance with claim 13, wherein said detector voltage given by $V^{optimum} \pm \Delta V$ wherein $\Delta V$ is of the order of $\pm 30\%$ of $V^{optimum}$.

18

16. A method in accordance with claim 11, wherein said detector is portably operable, and wherein said detector voltage that substantially compensates for incomplete charge collection is provided for by a battery.

17. A method according to claim 1, wherein said gamma or X-ray radiation is detected to obtain a spectrum having a substantially optimal spectroscope Figure of Merit (FOM).

18. A method in accordance with claim 15, wherein said FOM is given by:

$$FOM = \frac{(N_{peak}/N_{total})}{FWHM\%},$$

where,
$N_{peak}$ = integrated number of counts at peak of spectrum due to a given photon interaction in the detector,
$N_{total}$ = total number of counts due to said given photon interaction in the detector, FWHM % = Full Width Half Maximum of said peak of said spectrum in percentage, and substantially optimal value of this FOM is at least 0.1.

19. A method according to claim 17, wherein said FOM is given by:

$$FOM = \frac{(Peak/Valley)}{FWHM\%},$$

where,
Peak = height of peak of spectrum due to a given photon interaction in the detector,
Valley = height of the valley of said spectrum behind the peak due to said given photon interaction in the detector, and
FWHM % = Full Width Half Maximum of said peak of said spectrum in percentage, and substantially optimal value of this FOM is at least 1.

20. A monolithic room temperature solid state gamma or X-ray detector with segmented readout, intended for operation at a detector voltage applied thereto, having a thickness D and a segment's dimension $D_{pad}$, the detector being characterized in that its electron mean path length $\lambda_e$ is substantially close to $[\lambda_e]_{optimum}$ described by the following equation:

$$[\lambda_e]_{optimum}/D = 2.4 * (D/D_{pad} - 0.4),$$

thereby ensuring compensation for the effects of incomplete charge collection.

21. An array of detectors comprising a plurality of individual detectors, each individual detector comprising an individual detector material of a given detector material quality and having an individual thickness; wherein a separate detector voltage that substantially compensates for incomplete charge collection is applied to each said individual detector; said separate detector voltage causing controlled electron trapping in each said individual detector.

22. An array of room temperature solid state gamma or X-ray detectors in accordance with claim 21, wherein each of said individual detectors has a first common non-segmented electrode and a second electrode with segmented readout, said segmented readout comprising segmented elements.

23. An array of room temperature solid state gamma or X-ray detectors in accordance with claim 22, wherein said detector array is partitioned into sections, each section containing at least one detector and wherein all of said at least one detector contained in a given section have substantially the same detector material quality and substantially the same thickness.

24. An array of room temperature solid state gamma or X-ray detectors in accordance with claim 23, wherein each of the sections that contain more than one detector, the voltage applied to each of said more than one detector is essentially the same.

25. An array of room temperature solid state gamma or X-ray detectors in accordance with claim 24, wherein said sections consisting of detectors of similar material are arranged in parallel rows, and wherein each row consists of detectors of comparable quality.

26. An array of room temperature solid state gamma or X-ray detectors in accordance with claim 25, wherein substantially the same detector voltage is applied to each of the detectors in a given section of the array, whereby incomplete charge collection is compensated for to substantially the same degree for each detector in a given section by controlling to essentially the same degree the electron trapping in each detector of a given section.

27. An array of room temperature solid state gamma or X-ray detectors in accordance with claim 26, wherein said parallel rows are arranged according to decreasing detector voltage and an appropriate voltage divider chain across the parallel rows maintains substantially the same applied detector voltage on each detector in a given row.

28. An array of room temperature solid state gamma or X-ray detectors in accordance with claim 22, wherein said material quality is characterized by the detector's electron trapping parameter $(\mu\tau)_e$ and said detector voltage is substantially given by $V^{optimum}$, given by $$V^{optimum}=0.45*D^2/(\mu\tau)_e(e^{D/Dpad})1.08 \text{ or by}$$

$$V^{optimum}=2.4*D^2/(\mu\tau)_e(D/Dpad-0.4).$$

29. A gamma or X-ray camera, comprising an array of room temperature solid state gamma or X-ray detectors, according to claim 21.

30. A monolithic room temperature solid state gamma or X-ray detector with segmented readout, being designed for operation at a detector voltage V and having a thickness D, the detector being characterized in that is electron trapping property $(\mu\tau)_e$, is essentially close to $[(\mu\tau)_e]_{optimum}$ described by one of the following equation:

$$[(\mu\tau)_e]_{optimum}=0.45D^2/V*(e^{D/Dpad})^{1.08} \text{ or}$$

$$[(\mu\tau)_e]_{optimum}=2.4*D^2/V*(D/D_{pad}-0.4)$$

thereby ensuring optimum compensation for the effects of the incomplete charge collection.

* * * * *

UNITED STATES PATENT AND TRADEMARK OFFICE
CERTIFICATE OF CORRECTION

PATENT NO. : 6,331,705 B1  
DATED : December 18, 2001  
INVENTOR(S) : Yosef Eisen et al.

Page 1 of 1

It is certified that error appears in the above-identified patent and that said Letters Patent is hereby corrected as shown below:

Column 16,  
Line 52, change "$(\lambda\tau)_e$" to -- $(\mu\tau)_e$ --.

Column 17,  
Line 51, change "$v^{optimum} = ...$" to -- $V^{optimum} = ...$ --.

Signed and Sealed this

Nineteenth Day of March, 2002

Attest:

JAMES E. ROGAN  
*Attesting Officer*     *Director of the United States Patent and Trademark Office*